(12) United States Patent
Ito et al.

(10) Patent No.: US 7,563,832 B2
(45) Date of Patent: Jul. 21, 2009

(54) PHOTOCURABLE RESIN COMPOSITION AND RESIN COMPOSITION FOR PLASTICS COMPRISING THE SAME

(75) Inventors: Yuichi Ito, Sodegaura (JP); Satoru Suda, Sodegaura (JP); Yasushi Mizuta, Sodegaura (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 409 days.

(21) Appl. No.: 11/185,729

(22) Filed: Jul. 21, 2005

(65) Prior Publication Data

US 2006/0020051 A1 Jan. 26, 2006

(30) Foreign Application Priority Data

Jul. 22, 2004 (JP) ............................. 2004-214351

(51) Int. Cl.
*C09D 11/00* (2006.01)
*C09D 133/04* (2006.01)
*C09D 135/06* (2006.01)

(52) U.S. Cl. .................... 522/129; 522/31; 523/160
(58) Field of Classification Search ................ 522/121, 522/129, 31; 523/160
See application file for complete search history.

(56) References Cited

U.S. PATENT DOCUMENTS

| | | | |
|---|---|---|---|
| 4,688,053 A | | 8/1987 | Noguchi et al. |
| 5,721,020 A | * | 2/1998 | Takami et al. ............... 427/508 |
| 6,130,025 A | * | 10/2000 | Chikaoka et al. ......... 430/280.1 |
| 6,166,100 A | * | 12/2000 | Hiwara et al. ............... 522/110 |
| 2003/0158286 A1 | | 8/2003 | Nishizaki et al. |

FOREIGN PATENT DOCUMENTS

| | | |
|---|---|---|
| EP | 0 307 919 A2 | 3/1989 |
| JP | 1-104646 A | 4/1989 |
| JP | 2003-212965 A | 7/2003 |

OTHER PUBLICATIONS

Database WPI, Section Ch, Week 198922, Derwent Publications, Ltd., London, Great Britain; AN 1989-161899, XP002397261.

* cited by examiner

*Primary Examiner*—Susan W Berman
(74) *Attorney, Agent, or Firm*—Buchanan Ingersoll & Rooney PC

(57) ABSTRACT

A photocurable resin composition comprises a cationic polymerizable compound (A), an acrylic resin (B) and a cationic photopolymerization initiator (C), in which the acrylic resin (B) has a cationic polymerizable functional group, and the content of the component (A) is 30 to 95 parts by mass and the content of the component (B) is 5 to 70 parts by mass, based on 100 parts by mass of the total amount of the components (A) and (B). In addition, the functional group of the acrylic resin (B) preferably contains at least one of a cyclic ether group, a vinyloxy group, an acid adduct of a vinyloxy group, and an active hydrogen group, with the active hydrogen group preferably being a hydroxyl group. The photocurable resin composition has sufficient curability and sufficient adhesiveness to rigid plastics such as polycarbonate and PET having poor adhesive property.

21 Claims, No Drawings

PHOTOCURABLE RESIN COMPOSITION AND RESIN COMPOSITION FOR PLASTICS COMPRISING THE SAME

BACKGROUND OF THE INVENTION

1. Field of the Invention

The present invention relates to a photocurable resin composition for paints, adhesives, ink or the like, which is cured by light irradiation, and in particular, for rigid plastics such as polycarbonate, PET, and ABS resins having poor adhesive property.

2. Description of the Related Art

In resent years, plastic materials have been used widely in the field of electronic information materials. For example, polycarbonate, which is a rigid plastic, has been used frequently as a material for a cellular phone or an optical disk. Similarly, a PET resin has been used as a material for an optical film, and an ABS resin has been used as a material for the housing of home information appliances. In the processes for their productization, there are processes of adhering, coating, and printing by photocuring such rigid plastics. However, these materials have poor adhesive property. Meanwhile, the materials for paints, adhesives, ink and the like requires high adhesiveness to a resin matrix.

One method of providing high adhesive property, there has been known an effective method of decreasing residual stress generated in the adhesive interface by low curing shrinkage when curing the resin matrix. As a method of achieving the low curing shrinkage, a curing system using cationic ring-opening photopolymerization of cyclic ether such as an epoxy resin or an oxetane resin having low curing shrinkage has been proposed from a conventional curing system using additive polymerization by radical photopolymerization using an acrylic monomer and the like. However, the curing system using cationic ring-opening photopolymerization had difficulties in incorporating a functional group capable of interacting with rigid plastics to be adhered, thus the adhesive property was not given sufficiently.

Therefore, a comb polymer as an effective ingredient, which an anchor as a pigment dispersing agent is a base and which is in liquid state at room temperature, is added to a cationic ring-opening polymerization system containing an epoxy compound, an oxetane compound, a cationic photopolymerization initiator, a pigment as a coloring agent and a pigment dispersing agent in an attempt to exhibit adhesive property with a body to be adhered, thus sufficient adhesive property is exhibited (for example, see Japanese Unexamined Patent Application Publication No. 2003-212965). However, since this system contains basic materials which may act as a retarder (reaction inhibitor) in cationic ring-opening photopolymerization reaction, it has a drawback in that a sufficient curing rate, necessary for productivity, is not exhibited.

SUMMARY OF THE INVENTION

The present invention provides a photocurable resin composition having sufficient photocurability and sufficient adhesive property to rigid plastics such as polycarbonate and PET which has poor adhesive property.

The inventors have conducted extensive researches and discovered that sufficient curability and adhesiveness is exhibited by adding a specific acrylic resin which is given a cationic polymerizable functional group with a cationic photopolymerization system containing a cationic polymerizable compound such as an epoxy compound or an oxetane compound and a cationic photopolymerization initiator.

Specifically, an advantage of the invention is that it provides a photocurable resin composition comprising a cationic polymerizable compound (A), an acrylic resin (B), a cationic photopolymerization initiator (C), wherein the acrylic resin (B) has a cationic polymerizable functional group, and the content of the component (A) is 30 to 95 parts by mass and the content of the component (B) is 5 to 70 parts by mass, based on 100 parts by mass of the total amount of the components (A) and (B).

Further, a functional group of the acrylic resin (B) preferably contains at least one of a cyclic ether group, a vinyloxy group, an acid adduct of a vinyloxy group and an active hydrogen group, with the active hydrogen group being a hydroxyl group is more preferable. Also, the weight average molecular weight (in terms of polystyrene) of the acrylic resin (B) is preferably in a range of 1,000 to 100,000.

The cationic polymerizable compound (A) preferably contains a cyclic ether group, and more preferably an epoxy group and/or an oxetanyl group.

In addition, another advantage of the invention is that it provides a coating composition, an adhesive composition and an ink composition for plastics, which comprises the photocurable resin composition as described above.

DESCRIPTION OF THE PREFERRED EMBODIMENTS

Hereinafter, the present invention will be described in detail.

Cationic Polymerizable Compound (A)

The cationic polymerizable compound (A) used in the invention has at least one cationic polymerizable functional group in one molecular chain. In particular, the component (A) includes compounds having cyclic ether such as an oxirane ring, an oxetane ring, a tetrahydrofuran ring, or the like in the molecule, cyclic formal, cyclic carbonate, cyclic ester, vinyloxy, cyclic thioether (thiirane), cyclic olefin and styrene, but not limited thereto as long as it has cationic polymerizability. Among these, a compound having an epoxy group or an oxetanyl group is preferable. In this case, the compound may contain both an epoxy group and an oxetanyl group.

<Epoxy Compound>

Specific examples of the compound having an epoxy group include the compound having one epoxy group such as phenyl glycidyl ether and butyl glycidyl ether, and the compound having two epoxy groups such as hexanediol diglycidyl ether, tetraethyleneglycol diglycidyl ether, trimethylolpropane triglycidyl ether, bisphenol A diglycidyl ether, bisphenol F diglycidyl ether, novolac glycidyl ether, hexahydrophthalic acid glycidyl ester, dimeric acid glycidyl ester, tetraglycidyl aminodiphenyl methane, 3,4-epoxy-6-methylcyclohexylmethyl carboxylate, triglycidyl isocyanurate, 3,4-epoxycyclohexylmethyl carboxylate, polypropylene diglycidyl ether, and glycidyl ether such as diglycidyl ether modifier at both ends of polybutadiene or polysulfide. Further, examples of the component (A) also include alicyclic epoxys such as 3,4-epoxy-cyclohexylmethyl-3,4-epoxycyclohexane carboxylate and bis-(3,4-epoxycylohexyl) adipate.

In addition, from cyclic ether having the same 3-memebred ring structure as the epoxy group, a compound having a functional group represented by Chemical Formula 1 are provided as the component (A) of the invention.

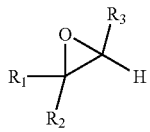

[Chemical Formula 1]

wherein $R_1$ and $R_2$ are a saturated or unsaturated carbon atom, and $R_3$ is a hydrogen atom or a saturated or unsaturated carbon atom.

A compound having at least one oxirane ring group represented by Chemical Formula 1 in one molecular chain, wherein one of the carbon atoms constituting the oxirane ring is substituted with at least one hydrogen atom, and the other carbon atom is substituted with two carbon atoms, and the substituted carbon atoms have either a saturated or unsaturated bond. Further, the saturated or unsaturated bond of the carbon atom may be substituted with an arbitrary atomic group.

In particular, $R_1$ and $R_2$ represent hydrocarbons consisting of any one of alkane, alkene, and alkyne, and may have a substituent. Examples of the substituent include an alkyl group, cycloalkane, an aromatic ring, a halogen atom, a hydroxyl group, ether, aldehyde, ketone, an ester group, an amide group substituted with alkyl, an amino group substituted with alkyl, and the like, but it is not particularly limited thereto. $R_3$ represents, in addition to a hydrogen atom, hydrocarbons consisting of any one of alkane, alkene, and alkyne, and may have a substituent. Examples of the substituent include an alkyl group, cycloalkane, an aromatic ring, a halogen atom, a hydroxyl group, ether, aldehyde, ketone, an ester group, and the like, but it is not particularly limited thereto.

More specific examples of a compound having at least one oxirane ring group represented by Chemical Formula 1 in one molecular chain include terpinolene dioxide, isobutylene oxide, isoprene oxide, β-pinene oxide, 2-methyl glycidol, limonene dioxide, methyl 2-methylglycidate, 7-oxa-bicyclo[4.1.0]heptane oxiranyl, 2-acetyl-2-methyloxirane, 2-(benzyloxymethyl)-2-methyloxirane, 5,6-epoxy-4,7-methano-1-oxaspiro-(2,5)-octane, 2-methyl-1-(2-methyl-oxiranyl)-non-3-en-1-ol, myrcene dioxide, or the like. Specifically, since the compound has at least one or more typical oxirane ring structure represented by Chemical Formula 1 such as terpinolene dioxide, limonene dioxide, 7-oxa-bicyclo[4.1.0]heptane oxiranyl, 5,6-epoxy-4,7-methano-1-oxaspiro-(2,5)-octane, or myrcene dioxide in a molecular chain, a structure having cationic polymerizability such as other oxirane ring may be included in the same molecule.

<Oxetane Compound>

Specifically, a compound having an oxetanyl group is exemplified. Specific examples of a compound having one oxetanyl group include 3-ethyl-3-hydroxymethyl oxetane, 3-ethyl-3-phenoxymethyl oxetane, 3-ethyl-3-(2-ethylhexyloxymethyl) oxetane, 3-ethyl(triethoxysilylpropoxymethyl) oxetane, 3-cyclohexyloxymethyl-3-ethyl-oxetane or the like.

Specific examples of a compound having two oxetanyl groups include bis(3-ethyl-3-oxetanylmethyl) ether, 1,4-bis{[(3-ethyl-3-oxetanyl)methoxy]methyl}benzene or the like.

Specific examples of a compound having three or more oxetanyl groups include trimethylolpropane tris(3-ethyl-3-oxetanylmethyl) ether, pentaerythritol tris(3-ethyl-3-oxetanylmethyl) ether, pentaerythritol tetrakis(3-ethyl-3-oxetanylmethyl) ether, dipentaerythritol pentakis(3-ethyl-3-oxetanylmethyl) ether or the like.

These cationic polymerizable compounds may be used alone or in combination of two or more, but it is preferable to use in combination of a compound containing an oxetanyl group and a compound containing an epoxy group.

Acrylic Resin (B)

The acrylic resin (B) used in the invention is characterized in that it contains a cationic polymerizable functional group. That is, when curing by cationic ring-opening photopolymerization, the acrylic resin (B) is characterized by being incorporated into the cross-linked body of the cationic polymerizable compound (A) with covalent bond, which may be involved in any one of elementary reactions such as initiation, propagation, termination and chain transfer.

With regard to each elementary reaction, a cyclic ether group can be used for a functional group which may become an initiation terminal in the initiation reaction of cationic ring-opening polymerization. An oxonium ion which may be an initiation terminal is generated by adding a proton generated from a cationic photopolymerization initiator to the cyclic ether group. In addition, the initiation end of cationic additive polymerization is also useful for the ring-opening polymerization of cyclic ethers, and a functional group capable of forming a carbocation such as a vinyloxy group and an acid added structure of a vinyloxy group are provided in the invention. Next, a functional group capable of being incorporated into chain transfer or termination terminal may be mentioned of an active hydrogen group. Examples of the active hydrogen group include a hydroxyl group, a thiol group, and an amino group, with the hydroxyl group being most preferable. In addition, a functional group being incorporated into propagation reaction of cationic ring-opening polymerization may be mentioned of the cyclic ether group described above.

The functional groups in each elementary reaction will be exemplified below, but are limited thereto as long as they can be used in any one reaction of initiation, propagation, termination, and chain transfer described above. As the functional group with industrial usage due to its commercially available raw material contains at least one of a cyclic ether group, a vinyloxy group, an acid adduct of a vinyloxy group and an active hydrogen group.

The active hydrogen group is preferably carboxylic acid, a hydroxyl group, a thiol group and an amino group, and more preferably a hydroxyl group. The hydroxyl group may be an alcoholic hydroxyl group or a phenolic hydroxyl group, and preferably an alcoholic hydroxyl group. A method of incorporating these functional groups will be described below.

In general, as a method of incorporating a functional group into acrylic resin, a method may be mentioned of incorporating the functional group onto the side chain of a polymer by radical copolymerization of a radical polymerizable monomer having the functional group and other radical polymerizable monomers, or incorporating the functional group onto the end of a polymer molecule by using a radical polymerization initiator having the functional group on its segment such as 2,2'-azobis(2-hydroxymethylpropionitril) or a chain transferring agent having a functional group such as thioglycol at the time of radical polymerization. The radical polymerizable monomer having the above-mentioned functional group will be described in detail below.

Examples of a radical polymerizable monomer having a cyclic ether group on its side chain include (meth)acrylate monomers having a cyclic ether group on its side chain, and more specifically, glycidyl (meth)acrylate having a glycidyl group, 3-ethyl-3-oxetanylethyl (meth)acrylate having an oxetanyl group, 3,4-epoxycyclohexylmethyl (meth)acrylate having an alicyclic epoxy group, methylglycidyl methacrylate in which a substituted methyl group is added into a glycidyl group, tetrahydrofurfuryl (meth)acrylate having a tetrahydrofuran ring, and the like.

Examples of a radical polymerizable monomer having a vinyloxy group on its side chain include 2-(vinyloxyethoxy) ethyl (meth)acrylate having an acryloyl group and a vinyloxy group in one molecule. In addition, a structure in which an acid such as acetic acid, trifluoroacetic acid, and hydrochloric acid is further added to the vinyloxy group is provided in the invention. Examples of a radical polymerizable monomer having a hydroxyl group on its side chain include 2-hydroxyethyl (meth)acrylate, hydroxypropyl (meth)acrylate, a ring-opening adduct of ε-carprolactone of 2-hydroxyethyl (meth)acrylate, a mixed and/or single adduct of ethylene oxide and/or propylene oxide of (meth)acrylic acid ester, and the like, but not particularly limited thereto. Further, a functional group, which potentially generate a hydroxyl group by using an acid catalyst and the like, such as (2-methyl-2-ethyl-1,3-dioxolane-4-yl)methyl (meth)acrylate of a (hemi)acetal structure, a benzyl group and a tert-butyl group is provided in the invention.

The acrylic resin (B) generally implies copolymers of a radical polymerizable monomer having the above-mentioned functional groups on its side chain and other radical polymerizable monomer. The other radical polymerizable monomer may be mentioned of (meth)acrylates. Examples of an ester group of the (meth)acrylates preferably include those having nonfunctional alkyl ester having a linear or branched structure, such as a methyl group, an ethyl group, an isopropyl group, a normal butyl group, an isobutyl group, a tert-butyl group, a 2-ethylhexyl group, a cyclohexyl group, a benzyl group, an isobornyl group, a lauryl group, a myristyl group or the like. In addition, monomers constituting the component (B) of the invention can be copolymerized with (meth)acrylates such as styrene, α-methylstyrene, vinyl acetate and the like.

The radical polymerizable monomer having the above-mentioned functional group on its side chain and the other radical polymerizable monomer perform radical polymerization within an organic solvent by using organic peroxide or an azo compound as a radical polymerization initiator to obtain a copolymer. The resulting copolymer may be used as it is, but may be obtained as acrylic resin by removing the solvent from the resin solution containing the copolymer and the solvent. The obtained acrylic resin is used as the component (B).

The acrylic resin (B) is characterized by containing a cationic polymerizable functional group. The content of the radial polymerizable monomer having the cationic polymerizable functional group in the component (B) is generally 1 to 50% by weight, and preferably 1 to 30% by weight from the viewpoint of curability. The weight average molecular weight (in terms of polystyrene) of the acrylic resin (B) used in the invention, which is determined by means of gel permeation chromatography (GPC), is generally 1,000 to 100,000, and preferably 1,000 to 50,000 from the viewpoints of durability and adhesiveness.

Cationic Photopolymerization Initiator (C)

The cationic photopolymerization initiator (C) used in the invention is a compound which generates cationic species and Lewis acid when it is subjected to light.

Examples of an onium salt compound which generates cationic species and Lewis acid when subjected to active energy rays include a compound which is formed by the combination of anions such as diphenyl iodinium, 4-methoxydiphenyl iodinium, bis(4-methylphenyl) iodinium, bis(4-tert-butylphenyl) iodinium, bis(dodecylphenyl) iodinium, triphenylsulfonium, diphenyl-4-thiophenoxyphenyl sulfonium, bis[4-(diphenylsulfonio)-phenyl]sulfide, bis[4-(di(4-(2-hydroxyethyl)phenyl)sulfonio)-phenyl]sulfide, and η5-2,4-(cyclopentadienyl)[1,2,3,4,5,6-η-(methylethyl)benzene]-iron(1+), and anions such as tetrafluoroborate, hexafluorophosphate, hexafluoroantimonate, hexafluoroarsenate and hexachloroantimonate. In addition, commercially available products of the onium salt which generates cationic species and Lewis acid when subjected to active energy rays may include Uvacure 1590 and 1591 (all manufactured by Daicel UCB, brand name), San-Aid SI-110, SI-180, SI-100L, SI-80L, and SI-60L (all manufactured by Sanshin Chemical Industry Co., Ltd., brand name), ADEKA Optomer SP-100, SP-172, SP-170, and SP-152 (all manufactured by Ashai Denka Co., Ltd., brand name), 2074 (Rhodia, Ltd., brand name) and the like.

These cationic photopolymerization initiators may be used alone or in combination of two or more. The cationic photopolymerization initiator can be used by having a sensitizer such as thioxanthone or 2-ethyl anthraquinone added thereto. In addition, a combination of active energy rays and heat can be also used for polymerization.

The components (A), (B) and (C) exhibit greater curability and adhesiveness by the specific blending ratio. Specifically, the content of the component (A) is 30 to 95 parts by mass and the content of component (B) is 5 to 70 parts by mass, and preferably the content of the component (A) is 50 to 95 parts by mass and the content of the components (B) is 5 to 50 parts by mass, based on 100 parts by mass of the total amount of the components (A) and (B). It is preferable from the viewpoints of adhesiveness and curability, when the blending amounts of the components (A) and (B) are in the above ranges. In addition, the blending amount of the component (C) is 0.5 to 10.0 parts by mass, based on 100 parts by mass of the total amount of the components (A) and (B). It is preferable from the viewpoints of curability, water resistance, a coloring problem of resin, and the like, when the blending amount of the component (C) is in the above range.

Other resins can be optionally used for the composition according to the invention. Examples of the other resin component include polybutadiene, polychloroprene, polyether, polyester, styrene-butadiene-styrene block copolymers, petroleum resin, xylene resin, ketone resin, cellulose resin, fluorine-based oligomers, silicone-based oligomers, polysulfide-based oligomers, and the like. These may be used alone or in combination of two or more.

For a modifying agent, there may be mentioned, for example, an assistant polymerization initiator (photosensitizer), an antioxidant, a levelling agent, a wettability improving agent, an adhesiveness controller, a surfactant, a plasticizer, a light absorber, and the like. These may be used alone or in combination of two or more. A diluent can be used for providing and improving coatability. As a diluent, common organic solvent or monofunctional cyclic ether described above can be used.

The invention provides the photocurable resin composition having sufficient photocurability and sufficient adhesive property to rigid plastics such as polycarbonate and PET which has poor adhesion property, thus may be used as a composition for plastic coating. In addition, the composition can be used for a binder for adhesives and ink. Further, the composition can be used for the materials of an optical disk that requires adhesive property and coatability with a high degree of accuracy, in particular, protective coating agents or adhesives for an optical disk.

EXAMPLES

Hereinafter, the present invention will be described in detail with reference to Examples and Comparative Examples. Further, evaluations with respect to curability and adhesiveness were carried out in the following manner for Examples and Comparative Examples.

Curability

A photocurable resin composition was applied in a thickness of 100 μm onto a polycarbonate plate or a polyethylene terephthalate (PET) plate (4.5 cm×2.0 cm×0.2 cm) using an applicator, and it was subjected to light irradiation of 1 J/cm$^2$ using a metal halide lamp. Immediately after the light irradiation, the degree of curing of the applied layer on the surface of polycarbonate plate was visually evaluated. For the degree of curing, the case evaluated as cured without adhesion (tack) is indicated by "O", the case evaluated as cured only at the surface or as being adhesion (tack) only at the surface is indicated by "Δ", and the case evaluated as not cured is indicated by "x".

Adhesiveness

A photocurable resin composition was applied in a thickness of 100 μm onto a polycarbonate plate and a polyethylene terephthalate (PET) plate (4.5 cm×2.0 cm×0.2 cm) using an applicator, and it was subjected to light irradiation of 1 J/cm$^2$ using a metal halide lamp. The applied layer was subjected to the adhesion test using 25 grids with 2 mm mass in accordance with JIS K5400 8.5.2. Subsequently, the test specimen was kept in a constant temperature and humidity tester of 85° C.×80% for 100 hours, and then allowed to conduct the adhesion test again.

Preparation Example 1

To a 2-L acrylic resin composition preparation apparatus equipped with a stirrer, a thermometer, a reflux cooler and a dropping bath, which was under a nitrogen atmosphere, 340.0 g of xylene was put, and then the temperature was elevated to a polymerization temperature of 135° C. Herein, a mixture of 400 g of methyl methacylate, 50 g of styrene and 50 g of 2-hydroxyethyl methacrylate as radically polymerizable monomers, and 20 g of tert-butyl-2-ethyl hexanoate as a radical initiator was added dropwise over 4 hours. After completion of dropping, the reaction mixture was continuously stirred at 135° C. for 1 hour. Subsequently, xylene and remaining monomers were distilled off by having the preparation apparatus in vacuo to give an acrylic resin (B).

Preparation Examples 2 to 6 and 8

Reaction was performed in the same manner as in Preparation Example 1, except that the amounts of the radically polymerizable monomer and radical initiator were modified as shown in Table 1.

Preparation Example 7

Reaction was performed in the same manner as in Preparation Example 1, except that the amounts of the radically polymerizable monomer and radical initiator were modified and the polymerization temperature was modified to 100° C. as shown in Table 1.

Example 1

To an opaque brown bottle, 10 parts by mass of acrylic resin as a component (B), obtained in Preparation Example 1, and 60 parts by mass of hydrogenated bisphenol A-based epoxy resin (ADEKA resin EP-4080S, manufactured by Asahi Denka Co., Ltd.) and 30 parts by mass of di[1-ethyl(3-oxetanyl)]methyl ether (Aron oxetane OXT-221, manufactured by TOAGOSEI Co., Ltd.) as a component (A), were put. The mixture was heated while stirring until the components (A) and (B) became completely homogeneous. Subsequently, to the mixed resin solution at 60° C. or lower, 3 parts by mass of (tolylcumyl)iodonium tetrakis(pentafluorophenyl)borate (RHODORSIL PHOTOINITIATOR 2074, manufactured by Rhodia Ltd.) was added and dissolved as a cationic polymerization initiator (C) to give a photocurable resin composition.

The cationic polymerizable resin composition was evaluated according to the evaluation method described above. The evaluation results are shown in Table 3.

Examples 2 to 11

Reaction and evaluation were performed in the same manner as in Example 1, except that the kinds and amounts of the components (A), (B) and (C) shown in Table 2 were modified. The evaluation results are shown in Table 3.

In addition, the adhesiveness to a polyethylene terephthalate plate was tested in Example 4, and the results are shown in Table 4.

Comparative Example 1

To an opaque brown bottle, 70 parts by mass of hydrogenated bisphenol A-based epoxy resin (ADEKA resin EP-4080S, manufactured by Asahi Denka Co., Ltd.) and 30 parts by mass di[1-ethyl(3-oxetanyl)]methyl ether (Aron oxetane OXT-221, manufactured by TOAGOSEI Co., Ltd.) as a component (A) were put, and 3 parts by mass of (tolylcumyl)iodonium tetrakis(pentafluorophenyl) borate (RHODORSIL PHOTOINITIATOR 2074, manufactured by Rhodia Ltd.) as a cationic polymerization initiator (C) was added and dissolved to give a photocurable resin composition. The photocurable resin composition was evaluated according to the evaluation method described above. The evaluation results are shown in Table 3.

In addition, the adhesiveness to a polyethylene terephthalate plate was tested, and the results are shown in Table 4.

Comparative Example 2

To an opaque brown bottle were fed 68 parts by mass of hydrogenated bisphenol A-based epoxy resin (ADEKA resin EP-4080S, manufactured by Asahi Denka Co., Ltd.) and 30 parts by mass di[1-ethyl(3-oxetanyl)]methyl ether (Aron oxetane OXT-221, manufactured by TOAGOSEI Co., Ltd.) as a component (A) were put, and 3 parts by mass of (tolylcumyl)iodonium tetrakis(pentafluorophenyl) borate (RHODORSIL PHOTOINITIATOR 2074, manufactured by Rhodia Ltd.) as a cationic polymerization initiator (C) was added and dissolved. Herein, 2 parts by mass of a poly(ethyleneimine)/poly(1,2-hydroxystearic acid) graft polymer (SOLSPERSE 28000, manufactured by Avecia Ltd.) having a basic anchor, which is a comb polymer in liquid state at room temperature as disclosed in JP-A No. 2003-212965 was added to give a photocurable resin composition.

The photocurable resin composition was evaluated according to the evaluation method described above. The evaluation results are shown in Table 3.

Comparative Example 3

To an opaque brown bottle, 10 parts by mass of the acrylic resin obtained in Preparation Example 6 as a component (B), and 60 parts by mass of hydrogenated bisphenol A-based epoxy resin (ADEKA RESIN EP-4080S, manufactured by Asahi Denka Co., Ltd.) and 30 parts by mass of di[1-ethyl(3-oxetanyl)]methyl ether (Aron oxetane OXT-221, manufactured by TOAGOSEI Co., Ltd.) as a component (A) were put. The mixture was heated while stirring until the components (A) and (B) became completely homogeneous. Subsequently, to the mixed resin solution at 60° C. or lower, 3 parts by mass of (tolylcumyl)iodonium tetrakis(pentafluorophenyl)borate (RHODORSIL PHOTOINITIATOR 2074, manufactured by Rhodia Ltd.) was added and dissolved as a cationic polymerization initiator (C) to give a photocurable resin composition.

The cationic polymerizable resin composition was evaluated according to the evaluation method described above. The evaluation results are shown in Table 3.

TABLE 1

| | | Preparation Example 1 | Preparation Example 2 | Preparation Example 3 | Preparation Example 4 | Preparation Example 5 | Preparation Example 6 | Preparation Example 7 | Preparation Example 8 |
|---|---|---|---|---|---|---|---|---|---|
| Radical Polymerizable Monomer having a Functional Group | 2-Hydroxyethyl methacrylate | 10 | | | | 5 | | 10 | 10 |
| | Glycidyl methacrylate | | 10 | | | 5 | | | |
| | 3-Ethyl-3-oxetanylethyl methacrylate | | | 10 | | | | | |
| | 2-(Hydroxyethoxy)ethyl methacrylate | | | | 10 | | | | |
| Nonfunctional and Radical Polymerizable Monomer | Methyl methacrylate | 80 | 80 | 80 | 80 | 80 | 85 | 80 | 80 |
| | Styrene | 10 | 10 | 10 | 10 | 10 | 15 | 10 | 10 |
| Radical Initiator | tert-Butyl 2-ethyl hexanoate | 4 | 4 | 4 | 4 | 4 | 4 | 0.05 | 15 |
| Weight Average Molecular Weight (in terms of polystyrene) | | 12000 | 13000 | 11000 | 25000 | 13000 | 12000 | 200000 | 900 |

TABLE 2

| | | Example | | | | | | | | | | | Comparative Example | | |
|---|---|---|---|---|---|---|---|---|---|---|---|---|---|---|---|
| | | 1 | 2 | 3 | 4 | 5 | 6 | 7 | 8 | 9 | 10 | 11 | 1 | 2 | 3 |
| Component (A) | ADEKA resin EP4080S | 60 | 60 | 60 | 60 | 60 | 30 | 30 | 60 | 60 | 15 | 65 | 70 | 68 | 60 |
| | EPOMIX R140 | | | | | | | 10 | | | | | | | |
| | EPICOAT 1007 | | | | | | | 10 | | | | | | | |
| | Aron oxetane OXT-221 | 30 | 30 | 30 | 30 | 30 | 30 | 25 | 30 | 30 | 15 | 30 | 30 | 30 | 30 |
| | ADEKA resin KRM2110 | | | | | | | 10 | | | | | | | |
| | β-pinene oxide | | | | | | 5 | | | | | | | | |
| Component (B) | Preparation Example 1 | 10 | | | | | | 40 | 10 | | | | | | |
| | Preparation Example 2 | | 10 | | | | | | | | 70 | 5 | | | |
| | Preparation Example 3 | | | 10 | | | | | | | | | | | |
| | Preparation Example 4 | | | | 10 | | | | | | | | | | |
| | Preparation Example 5 | | | | | 10 | | | | | | | | | |
| | Preparation Example 6 | | | | | | | | | | | | | | 10 |
| | Preparation Example 7 | | | | | | | | | 10 | | | | | |
| | Preparation Example 8 | | | | | | | | | | 10 | | | | |
| Additive | Solsperse 28000 | | | | | | | | | | | | | 2 | |
| Component (C) | RHODORSIL PHOTOINITIATOR R 2074 | 3 | 3 | 3 | 3 | 3 | 3 | 3 | 3 | 3 | 3 | 3 | 3 | 3 | 3 |

TABLE 3

| Evaluation Item | | Example | | | | | | | | | | | Comparative example | | |
|---|---|---|---|---|---|---|---|---|---|---|---|---|---|---|---|
| | | 1 | 2 | 3 | 4 | 5 | 6 | 7 | 8 | 9 | 10 | 11 | 1 | 2 | 3 |
| Curability | | ○ | ○ | ○ | ○ | ○ | ○ | ○ | ○ | ○ | Δ | ○ | ○ | X | ○ |
| Adhesiveness | Initial stage | 25/25 | 25/25 | 25/25 | 25/25 | 25/25 | 25/25 | 25/25 | 20/25 | 25/25 | 25/25 | 25/25 | 0/25 | — | 25/25 |
| | After acceleration test | 25/25 | 25/25 | 25/25 | 25/25 | 25/25 | 25/25 | 25/25 | 20/25 | 20/25 | 25/25 | 20/25 | 0/25 | — | 0/25 |

TABLE 4

| Evaluation Item | | Example 4 | Comparative Example 1 |
|---|---|---|---|
| curability | | ○ | ○ |
| Adhesiveness | Initial stage | 25/25 | 20/25 |
| | After acceleration test | 25/25 | 15/25 |

The photocurable resin composition of the invention has sufficient curability, and closely adhere to polycarbonate, PET, and the like which are rigid plastics having poor adhesive property, and maintains the same adhesive property as that after an acceleration test. In addition, the photocurable resin composition of the invention can be used for coating materials, adhesives, ink, various sealing materials for the member of framework using rigid plastics such as polycarbonate and PET.

What is claimed is:

1. A photocurable resin composition comprising a cationic polymerizable compound (A), an acrylic resin (B), and a cationic photopolymerization initiator (C), wherein
    the cationic polymerizable compound (A) is used in combination of a compound containing an oxetanyl group and a compound containing an epoxy group,
    the acrylic resin (B) is a copolymer of a radical polymerizable monomer having a cationic polymerizable functional group and a second radical polymerizable monomer,
    said second radical polymerizable monomer is at least one selected from the group consisting of styrene, α-methylstyrene, vinyl acetate, and a (meth)acrylate whose ester group includes a methyl group, an ethyl group, an isopropyl group, a normal butyl group, an isobutyl group, a tert-butyl group, a cyclohexyl group, a benzyl group, or an isobornyl group, and
    the content of the component (A) is 30 to 95 parts by mass and the content of the component (B) is 5 to 70 parts by mass, based on 100 parts by mass of the total amount of the components (A) and (B).

2. The photocurable resin composition according to claim 1, wherein the cationic polymerizable functional group of the acrylic resin (B) contains at least one of a cyclic ether group, a vinyloxy group, an acid adduct of a vinyloxy group or an active hydrogen group.

3. A coating composition for plastics comprising the photocurable resin composition as claimed in claim 2.

4. An adhesive composition for plastics comprising the photocurable resin composition as claimed in claim 2.

5. An ink composition for plastics comprising the photocurable resin composition as claimed in claim 2.

6. The photocurable resin composition according to claim 2, wherein the active hydrogen group of the cationic polymerizable functional group of the acrylic resin (B) is a hydroxyl group.

7. A coating composition for plastics comprising the photocurable resin composition as claimed in claim 6.

8. An adhesive composition for plastics comprising the photocurable resin composition as claimed in claim 6.

9. An ink composition for plastics comprising the photocurable resin composition as claimed in claim 6.

10. The photocurable resin composition according to claim 1, wherein the weight average molecular weight of the acrylic resin (B) in terms of polystyrene is in a range of 1,000 to 100,000.

11. The photocurable resin composition according to claim 10, wherein the cationic polymerizable compound (A) contains an epoxy group and an oxetanyl group.

12. A coating composition for plastics comprising the photocurable resin composition as claimed in claim 11.

13. An adhesive composition for plastics comprising the photocurable resin composition as claimed in claim 11.

14. An ink composition for plastics comprising the photocurable resin composition as claimed in claim 11.

15. A coating composition for plastics comprising the photocurable resin composition as claimed in claim 10.

16. An adhesive composition for plastics comprising the photocurable resin composition as claimed in claim 10.

17. An ink composition for plastics comprising the photocurable resin composition as claimed in claim 10.

18. A coating composition for plastics comprising the photocurable resin composition as claimed in claim 1.

19. An adhesive composition for plastics comprising the photocurable resin composition as claimed in claim 1.

20. An ink composition for plastics comprising the photocurable resin composition as claimed in claim 1.

21. The photocurable resin composition as claimed in claim 1, wherein a content of the radical polymerizable monomer having a cationic polymerizable functional group in the acrylic resin (B) is 1 to 10% by weight.

* * * * *